US006809037B2

United States Patent
Nishizawa (10) Patent No.: US 6,809,037 B2
(45) Date of Patent: Oct. 26, 2004

(54) MANUFACTURING METHOD OF SEMICONDUCTOR INTEGRATED CIRCUIT INCLUDING SIMULTANEOUS FORMATION OF VIA-HOLE REACHING METAL WIRING AND CONCAVE GROOVE IN INTERLAYER FILM AND SEMICONDUCTOR INTEGRATED CIRCUIT MANUFACTURED WITH THE MANUFACTURING METHOD

(75) Inventor: Atsushi Nishizawa, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/751,979

(22) Filed: Dec. 29, 2000

(65) Prior Publication Data

US 2001/0008802 A1 Jul. 19, 2001

(30) Foreign Application Priority Data

Jan. 18, 2000 (JP) ........................................ 2000-009221

(51) Int. Cl.[7] ............................................ H01L 21/302
(52) U.S. Cl. ...................... 438/714; 438/725; 438/751; 438/749; 438/734; 430/5
(58) Field of Search ................................. 438/725, 714, 438/723, 734, 736, 743, 717, 749, 751; 430/5

(56) References Cited

U.S. PATENT DOCUMENTS 5,883,006 A * 3/1999 Iba .............................. 438/712
6,042,999 A * 3/2000 Lin et al. ..................... 430/316
6,057,239 A * 5/2000 Wang et al. ................. 438/689
6,262,484 B1 * 7/2001 Rangarajan et al. ........ 257/752
6,323,123 B1 * 11/2001 Liu et al. ..................... 438/638
6,362,093 B1 * 3/2002 Jang et al. ................... 438/633
6,380,096 B2 * 4/2002 Hung et al. ................. 438/723

FOREIGN PATENT DOCUMENTS

| JP | 09-312291 | 12/1997 |
| JP | 11-233618 | 8/1999 |
| JP | 11-274299 | 10/1999 |

OTHER PUBLICATIONS

Taiwanese Office Action Dated Jul. 16, 2003.
ULSI Technology, International Editions 1996 ISBN 0–07–063062–3, p. 445.
Wolf et al., "Silicon Processing for the VLSI Era" vol. 1: Process Technology 1986 ISBN: 0–961672–3–7, pp. 550–553.

* cited by examiner

Primary Examiner—George A. Goudreau
(74) Attorney, Agent, or Firm—Katten Muchin Zavis Rosenman (57) ABSTRACT

The present invention relates to a method of manufacturing a semiconductor integrated circuit in which a via hole reaching a metal wiring and a concave groove are simultaneously formed in an interlayer film. When the interlayer film and the material of an organic film embedded in the via hole are etched, the etching rate for the material of the organic film with an etching gas is set to be higher than the etching rate for the interlayer film with an etching gas. Thus, plasma etching does not proceed in a state in which the material of the organic film projects from the bottom of the concave groove formed in the interlayer film, and the production of depositions is prevented.

10 Claims, 6 Drawing Sheets

MANUFACTURING METHOD OF SEMICONDUCTOR INTEGRATED CIRCUIT INCLUDING SIMULTANEOUS FORMATION OF VIA-HOLE REACHING METAL WIRING AND CONCAVE GROOVE IN INTERLAYER FILM AND SEMICONDUCTOR INTEGRATED CIRCUIT MANUFACTURED WITH THE MANUFACTURING METHOD

BACKGROUND OF THE INVENTION

1. Field of the Invention

The present invention relates to a manufacturing method of a semiconductor integrated circuit including simultaneous formation of a via hole reaching a metal wiring and a concave groove in an interlayer film, and a semiconductor integrated circuit manufactured with the manufacturing method.

2. Description of the Relate Art

In recent years, higher performance and finer size are required for semiconductor integrated circuits, and various manufacturing methods and materials for use are under study. Conventionally, polysilicon and aluminum have often been used for wirings in the semiconductor integrated circuits. However, materials with lower resistance are needed to realize higher performance and finer size of the semiconductor integrated circuits.

To address such a need, the use of copper has been proposed to form fine wirings in a semiconductor integrated circuit. However, copper has properties which make patterning with etching difficult, and has low corrosion resistance. Thus, a dual damascene method has been developed as a method of manufacturing a semiconductor integrated circuit in which metal wirings made of copper are formed within and on a surface of an interlayer film and the metal wirings are connected to each other with a contact made of copper.

A prior art of the method of manufacturing a semiconductor integrated circuit with the dual damascene method is hereinafter described with reference to FIG. 1A to FIG. 4C. The drawings of FIG. 1A to FIG. 4C are front section views sequentially showing manufacturing steps of a semiconductor integrated circuit.

First, semiconductor integrated circuit 100 to be manufactured in this case is described. As shown in FIG. 4C, semiconductor integrated circuit 100 comprises lower interlayer film 101 made from $SiO_2$ and upper interlayer film 102. Upper interlayer film 102 is disposed on stopper film 115 layered on the surface of the lower interlayer film 101. Lower metal wiring 103 made of copper is embedded in an upper portion of lower interlayer film 101. Upper metal wiring 104 made of copper is also embedded in an upper portion of upper interlayer film 102, and connecting wiring 105 formed integrally with upper metal wiring 104 is connected to lower metal wiring 103.

Lower metal wiring 103 and upper metal wiring 104 extend, for example, in a direction passing through the drawing (hereinafter referred to as "front-to-back direction"). Connecting wiring 105 is formed to have the front-to-back length identical to the left-to-right width, for example. Connecting wiring 105 which does not extend in the front-to-back direction connects lower metal wiring 103 to upper metal wiring 104 at one point.

Figure 1A:
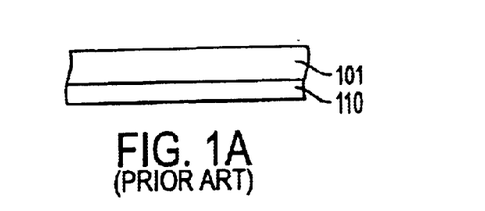
FIG. 1A to FIG. 1E are front section views for showing first to fifth steps of a conventional method of manufacturing a semiconductor integrated circuit with a dual damascene method.
Figure 1B:
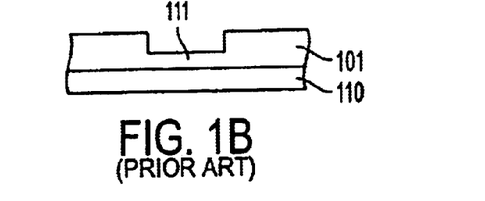

As a typical method of manufacturing semiconductor integrated circuit 100 configured as described above, as shown in FIG. 1A, lower interlayer film 101 made from $SiO_2$ with a predetermined thickness is formed on a surface of silicon substrate 100, and a photoresist (not shown) is applied on the surface thereof and then patterned to form a resist mask (not shown). Lower interlayer film 101 is dry etched through an opening in the resist mask, thereby forming concave 111 with a predetermined depth on the surface of lower interlayer film 101 as shown in FIG. 1B.

Figure 1C:
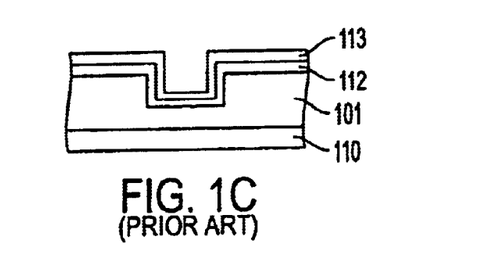

After concave 111 is completed, the resist mask is removed with plasma processing and organic removal in an atmosphere of $O_2$. Then, as shown in FIG. 1C, tantalum film 112 and copper film 113 are sequentially formed with sputtering on the surface of exposed lower interlayer film 101.

Figure 1D:
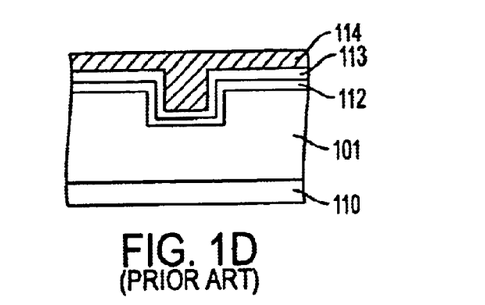
Figure 1E:
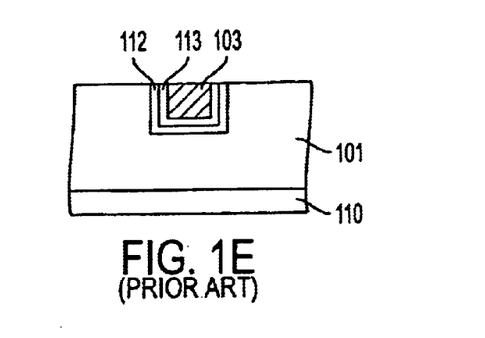

Next, as shown in FIG. 1D, plating film 114 made of copper is formed on the surface of copper film 113 to fill concave 111. As shown in FIG. 1E, plating film 114, copper film 113, and tantalum film 112 are polished flatly with CMP (Chemical Mechanical Polishing) until the surface of lower interlayer film 101 is exposed.

Figure 2A:
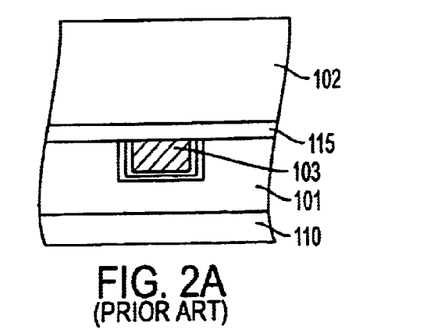
FIG. 2A to FIG. 2D are front section views for showing sixth to ninth steps of the manufacturing method.

Next, as shown in FIG. 2A, stopper film 115 made from SiN is grown to have a thickness of 500 [Å], for example, on the surface of the flatly polished surface with a plasma CVD (Chemical Vapor Deposition) process. Then, upper interlayer film 102 made from $SiO_2$ is grown to have a thickness of 12000 [Å], for example, on the surface of stopper film 115 with the plasma CVD process.

Figure 2B:
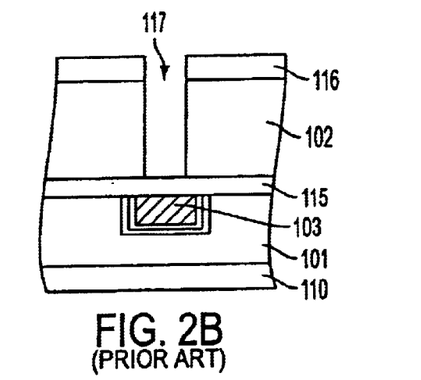

Resist mask 116 with an opening above upper metal wiring 103 is then formed on the surface of upper interlayer film 102, and upper interlayer film 102 is etched through the opening in resist mask 116, thereby forming via hole 117 extending from the surface of upper interlayer film 102 to the surface of stopper film 115 at the position opposite to lower metal wiring 103.

Figure 2C:
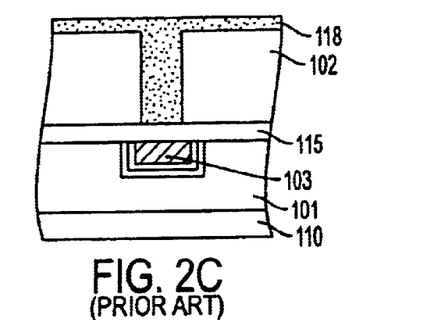

Resist mask 116 is removed after via hole 117 is formed. As shown in FIG. 2C, ARC (Anti Reflective Coating) film 118 serving as an organic film is formed to have a thickness of 2000 [Å] on the surface of upper interlayer film 102, and the material of ARC film 118 is filled in via hole 117.

Figure 2D:
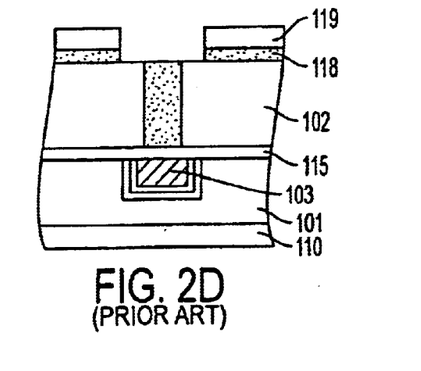

Resist mask 119 with an opening wider than via hole 117 is formed to have a thickness of 8000 [Å], for example, on the surface of ARC film 118. Then, in an atmosphere where an etching gas formed by mixing "$C_4F_8$" and "$O_2$," and an inert gas including "Ar" are maintained at a pressure of approximately 30 [mTorr], ARC film 118 is plasma etched through the opening in resist mask 119 as shown in FIG. 2D. The mixing ratio of "$C_4F_8$":"$O_2$":"Ar" is "20:10:200", for example.

Figures 3A, 3B:
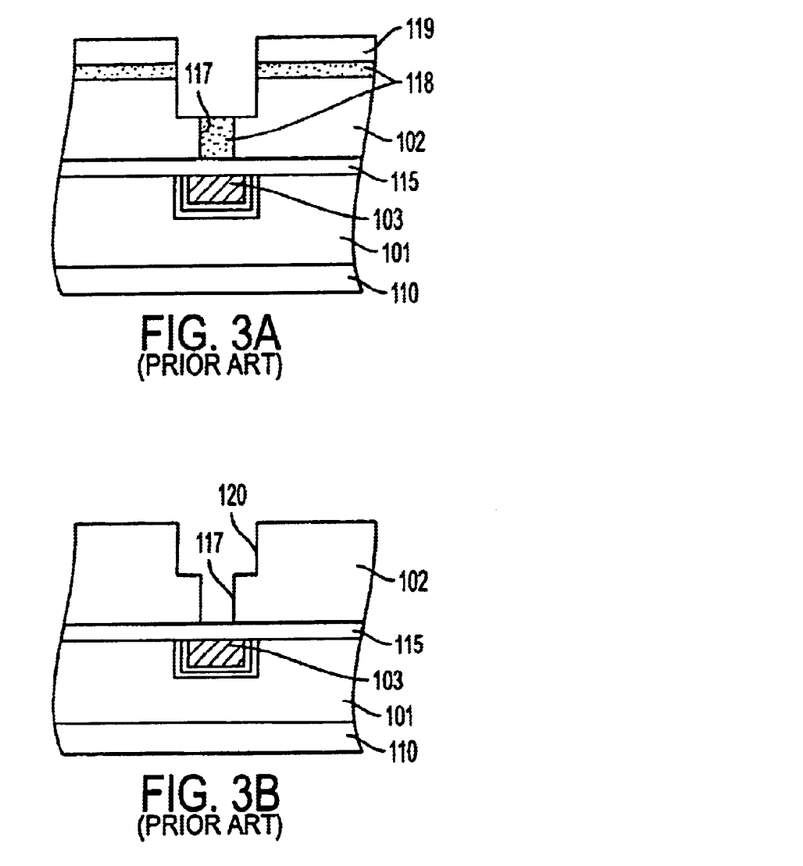
FIG. 3A to FIG. 3C are front section views for showing tenth and eleventh steps of the manufacturing method.

After ARC film 118 is plasma etched, the etching gas is changed to "$C_4F_8$" only, and as shown in FIG. 3A, ARC film 118 and upper interlayer film 102 are simultaneously plasma etched through the opening in resist mask 119 to form concave groove 120 which is wider than via hole 117. The depth of concave groove 120 is 4000 [Å] which does not reach stopper film 115.

At this point, since the etching rate of the plasma etching of upper interlayer film 102 and ARC film 118 with the etching gas including "$C_4F_8$" is approximately "4000 Å/min," the depth of concave groove 120 can be adjusted to 4000 [Å] by performing the etching for 1 minute.

Next, by means of plasma processing with "$O_2$" and removal processing with an amine organic remover, resist mask 119 and ARC film 118 are removed as shown in FIG. 3B to expose stopper film 115 at the bottom of via hole 117. It should be noted that while lower metal wiring 103 made of copper has low corrosion resistance, it is not subjected to corrosion since lower metal wiring 103 is shielded from surrounding environments by stopper film 115 when resist mask 119 and ARC film 118 are removed as described above.

Figure 3C:
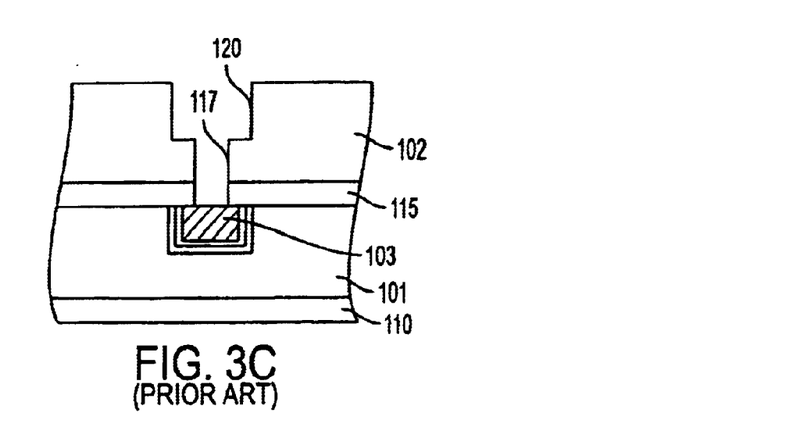

Subsequently, in an atmosphere of an etching gas formed by mixing "$CHF_3$" and "$O_2$," and an inert gas including "Ar," stopper film 115 exposed at the bottom of via hole 117 is plasma etched with upper interlayer film 102 used as a mask to expose lower metal wiring 103 at the bottom of via hole 117 as shown in FIG. 3C. The mixing ratio of "$CHF_3$":"$O_2$":"Ar" is also "20:10:200", for example.

Figure 4A:
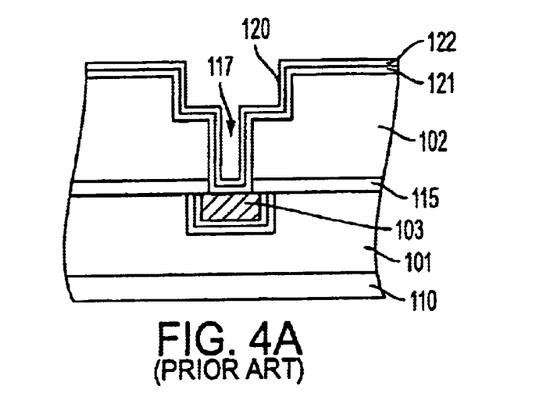
FIG. 4A to FIG. 4C are front section views for showing twelfth to fourteenth steps of the manufacturing method.

In this state, the exposed surfaces of upper interlayer film 102 and lower metal wiring 103 are cleaned with an amine organic remover, and as shown in FIG. 4A, tantalum nitride film 121 and copper film 122 are sequentially formed on the cleaned surfaces with sputtering. Thus, tantalum nitride film 121 and copper film 122 are formed to cover the upper surface of upper interlayer film 102 and the inner surfaces of concave groove 120 and via hole 117.

Figure 4B:
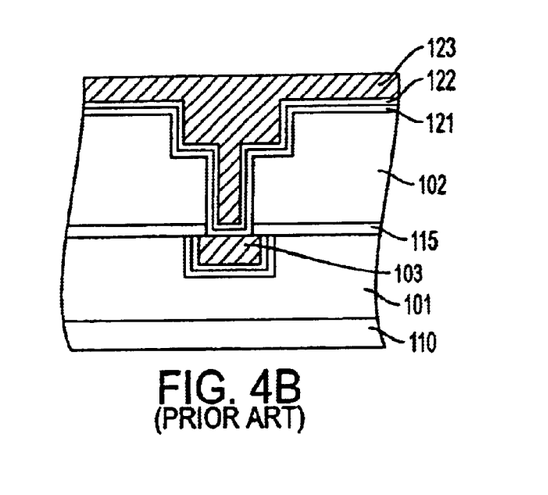
Figure 4C:
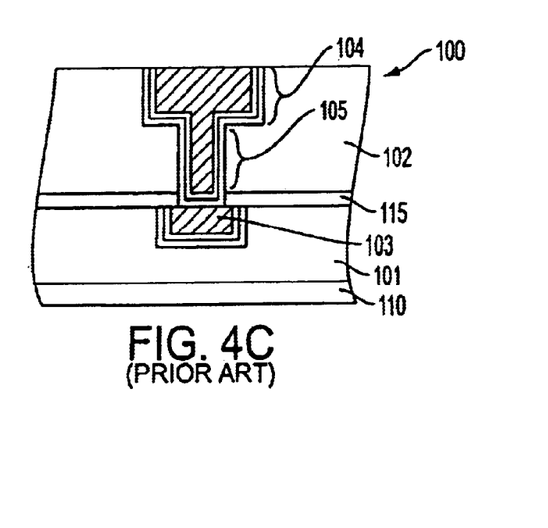

Then, as shown in FIG. 4B, plating film 123 made of copper is formed on the surface of copper film 122. At this point, the material of plating film 123 is filled in concave groove 120 and via hole 117.

Plating film 123, copper film 122, and tantalum nitride film 121 are flatly polished with the CMP until the surface of upper interlayer film 102 is exposed, thereby upper metal wiring 104 embedded in concave groove 120 and connecting wiring 105 embedded in via hole 117 are formed as shown in FIG. 4C. With the aforementioned steps, semiconductor integrated circuit 100 is completed.

The approach for simultaneously forming via hole 117 with a relatively small width and concave groove 120 with a relatively large width is usually called a dual damascene method. For the aforementioned interlayer films 101 and 102, a film with a low permittivity may be used other than the $SiO_2$ films. For the film with a low permittivity, a hydrogen-containing silicon oxide film or an organic substance-containing silicon oxide film may be used.

For the material of ARC film 118, polyvinylphenol or polymethylmetacrylate added to a base resin made from polyimide or novolac may be used. For the material of the resist, a novolac resin or a polyimide resin may be used.

The manufacturing of semiconductor integrated circuit 100 with the aforementioned method enables concave groove 120 with a relatively large width to be formed on via hole 117 with a relatively small width. Thus, it is possible to form a structure in which lower metal wiring 103 made of copper embedded in lower interlayer film 101 is connected to upper metal wiring 104 made of copper embedded in upper interlayer film 102 through connecting wiring 105 in via hole 117.

However, when ARC film 118 and upper interlayer film 102 are simultaneously plasma etched with the etching gas including "$C_4F_8$" as shown in FIG. 3A, the etching rate for ARC film 118 is actually lower than that of upper interlayer film 102. Thus, the plasma etching proceeds in a state in which ARC film 118 projects from the surface of upper interlayer film 102 at the bottom of concave groove 120.

Figure 5:
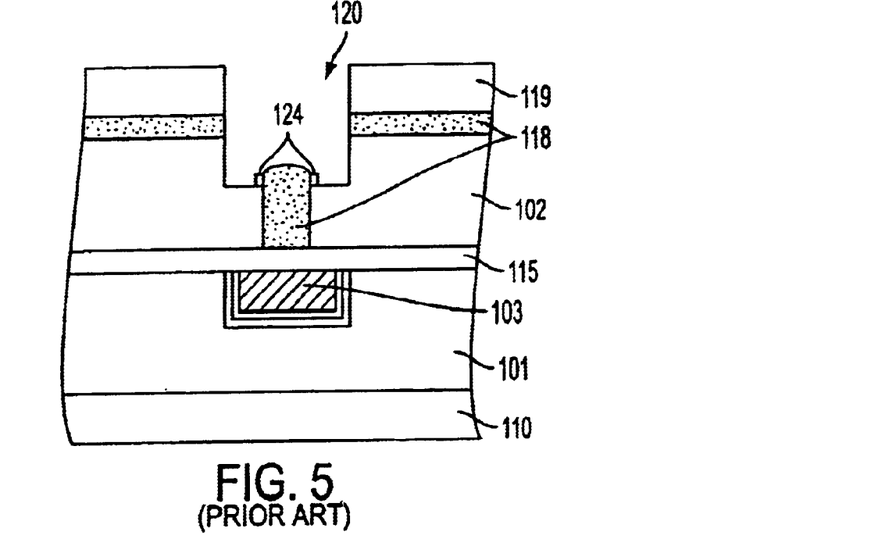
FIG. 5 is a front section view showing a state in which depositions accumulate on the sides of an ARC film projecting from the surface of an upper interlayer film in the manufacturing method.

In addition, the etching gas including "$C_4F_8$" is likely to produce deposition of fluorocarbon base from what is decomposed in the plasma or a reaction product. Thus, if the plasma etching proceeds in a state in which ARC film 118 projects from the surface of upper interlayer film 102 at the bottom of concave groove 120 as described above, depositions 124 tend to accumulate on the sides of ARC film 118 projecting from the surface of upper interlayer film 102 as shown in FIG. 5.

Figure 6:
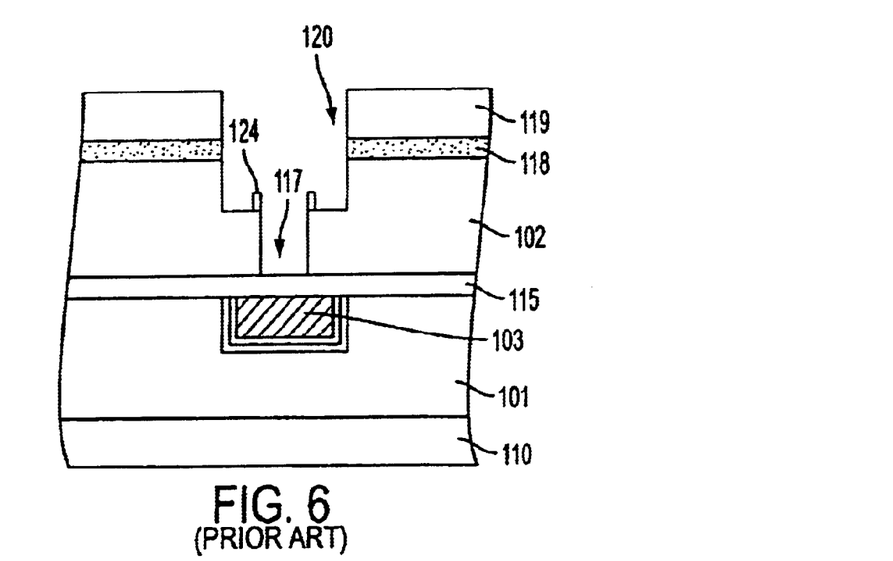
FIG. 6 is a front section view showing a state in which depositions remain around the opening of a via hole in the manufacturing method.

Depositions 124, if accumulated in this manner, serve as masks to inhibit the progression of the plasma etching thereunder. Thus, when ARC film 118 in via hole 117 is removed after the completion of the simultaneous etching of ARC film 118 and upper interlayer film 102, a disadvantage of remaining depositions 124 around the opening of via hole 117 occurs as shown in FIG. 6.

Such depositions 124 remaining around the opening of via hole 117 prevent the formation of upper metal wiring 104 in a favorable shape, and result in defects such as breaks.

SUMMARY OF THE INVENTION

It is an object of the present invention to provide a method of manufacturing a semiconductor integrated circuit in which no deposition remains around the opening of a via hole even when an upper interlayer film and an organic film are simultaneously plasma etched with a dual damascene method for forming a concave groove on the via hole.

In an aspect of the method of manufacturing a semiconductor integrated circuit of the present invention, when an upper interlayer film and the material of an organic film embedded in a via hole formed in the upper interlayer film are simultaneously plasma etched through an opening in a resist mask, the etching rate for the organic film material with an etching gas is higher than the etching rate for the upper interlayer film. Therefore, since the plasma etching does not proceed in a state in which the material of the organic film projects from the bottom of a concave groove formed in the upper interlayer film, and the production of depositions is prevented.

With aforementioned relationship of the etching rates, the plasma etching proceeds in a state in which the organic film material is dented from the bottom of the concave groove formed in the upper interlayer film. However, depositions tend to accumulate in terms of properties on the sides of the dent in the upper interlayer film.

In another aspect of the method of manufacturing a semiconductor integrated circuit of the present invention, the etching gas comprises a molecular structure which produces no deposition. Thus, depositions do not accumulate at portions such as a difference in height formed when the upper interlayer film and the organic film are simultaneously plasma etched with the dual damascene method.

In another aspect of the present invention, the etching gas may include the number of atoms of fluorine contained in the molecular structure three times or more than the number of atoms of carbon. In this case, since the number of the fluorine atoms contained in the molecular structure of the etching gas is relatively large, the etching rate for the organic film is higher than the etching rate for the upper interlayer film in terms of properties. Since the number of the carbon atoms contained in the molecular structure of the etching gas is relatively small, depositions are unlikely to be produced. Such an etching gas may comprise "$CF_4$" or "$C_2F_6$", for example.

In another aspect of the present invention, the pressure in an atmosphere may be "100 [mTorr]" or more, even "300 to 400 [mTorr]". In this case, since the high pressure of the etching gas increases the probability of the collision of ions, moving ions in various directions are produced to cause isotropic plasma etching, thereby sequentially removing depositions which may slightly accumulate.

The above and other objects, features and advantages of the present invention will become apparent from the following description with reference to the accompanying drawings which illustrate examples of the present invention.

DESCRIPTION OF THE PREFERRED EMBODIMENTS

An embodiment of the present invention is hereinafter described with reference to FIG. 7A to FIG. 7C. In the embodiment, however, portions identical to those in the aforementioned prior art are indicated with the same names and reference numerals, and description thereof is omitted.

Semiconductor integrated circuit 100 of the embodiment has the same structure after completion as that of the aforementioned prior art. In a method of manufacturing semiconductor integrated circuit 100 of the embodiment, similarly to the prior art manufacturing method, upper interlayer film 102 is disposed above the surface of lower interlayer film 101 including lower metal wiring 103 embedded therein through stopper film 115, and via hole 117 is formed to extend from the surface of upper interlayer film 102 to the position on the surface of stopper film 115 opposite to lower metal wiring 103 (see FIG. 2B).

ARC film 118 is formed on the surface of upper interlayer film 102, and the material of ARC film 118 is embedded in via hole 117 (see FIG. 2C). Resist mask 119 with an opening wider than via hole 117 is formed on the surface of ARC film 118. Then, as shown in FIG. 7A, ARC film 118 is plasma etched through the opening in resist mask 119.

The etching gas is changed after the completion of the plasma etching of ARC film 118. As shown in FIG. 7B, upper interlayer film 102 and ARC film 118 are simultaneously plasma etched through the opening in resist mask 119 to form concave groove 120 wider than via hole 117. The depth of concave groove 120 is set to a predetermined depth which does not reach stopper film 115.

Subsequently, the material of ARC film 118 remaining in via hole 117 at the bottom of plasma etched concave groove 120 is removed. Stopper film 115 positioned at the bottom of via hole 117 after the removal of the material is etched to expose lower metal wiring 103 as shown in FIG. 7C.

In the embodiment, however, "$CF_4$" is used as the etching gas when ARC film 118 and upper interlayer film 102 are simultaneously plasma etched with the dual damascene method, unlike the aforementioned prior art.

Figure 7A:
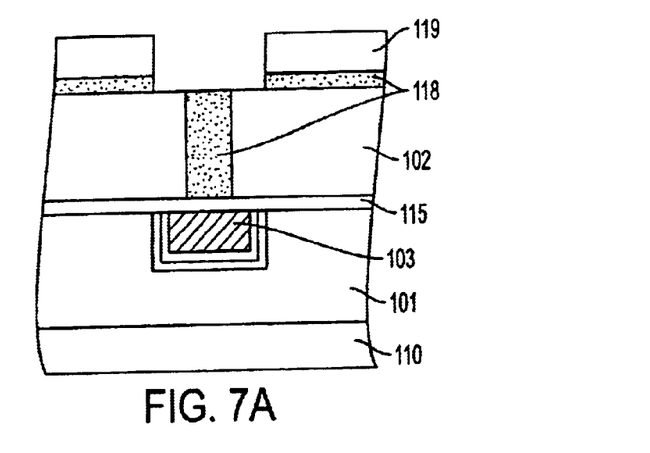
FIG. 7A to FIG. 7C are front section views showing main steps in a method of manufacturing a semiconductor integrated circuit in an embodiment of the present invention.
Figure 7B:
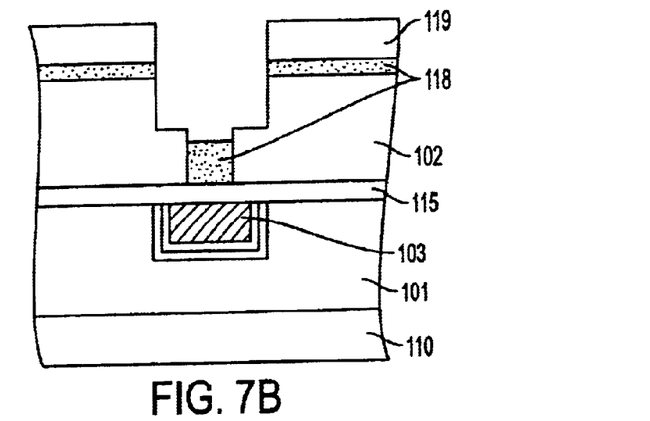

More specifically, when ARC film 118 is plasma etched through the opening in resist mask 119 as shown in FIG. 7A, the surrounding environment is set to a state in which an etching gas formed by mixing "$CF_4$" and "$O_2$," and an inert gas including "Ar" are maintained at a pressure of "300 to 400 [mTorr]". On the other hand, when ARC film 118 and upper interlayer film 102 are simultaneously plasma etched through the opening in resist mask 119 as shown in FIG. 7B after the completion of the aforementioned plasma etching, the etching gas is changed to "$CF_4$".

The mixing ratio of "$CF_4$":"$O_2$":"Ar" at the plasma etching of ARC film 118 is "100:10:500", for example. The mixing ratio of "$CF_4$":"Ar" at the simultaneous plasma etching of ARC film 118 and upper interlayer film 102 is "100:50", for example.

In the embodiment, when ARC film 118 and upper interlayer film 102 are simultaneously plasma etched through the opening in resist mask 119 with the dual damascene method, "$CF_4$" is used for the etching gas unlike the prior art.

In the plasma etching using "$CF_4$" for the etching gas, the etching rate for ARC film 118 is higher than the etching rate for upper interlayer film 102 in terms of properties. For this reason, as shown in FIG. 7B, the plasma etching does not proceed in a state in which the material of ARC film 118 projects from the surface of upper interlayer film 102 at the bottom of concave groove 120. Thus, no projection of the material of ARC film 118 is formed and no deposition accumulates on the sides of such a projection.

In addition, since the etching gas including "$CF_4$" has the number of atoms of fluorine contained in a molecular structure three times or more than the number of atoms of carbon, and the number of carbon atoms is relatively small and the number of fluorine atoms is relatively large, depositions of fluorocarbon base are unlikely to occur in terms of properties. Also, in the embodiment, since the pressure of the etching gas is as high as "300 to 400 [mTorr]", the Brownian movement of the molecules is active to cause isotropic plasma etching, thereby sequentially removing gradually accumulated depositions on the top from all directions.

Figure 7C:
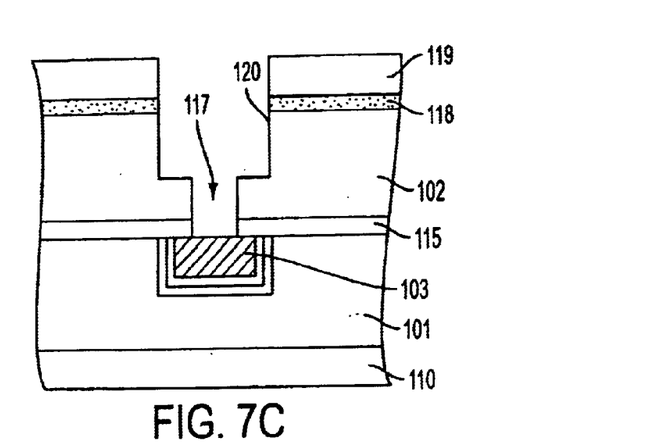

As a result, in the embodiment, when upper interlayer film 102 and ARC film 118 are simultaneously plasma etched through the opening in resist mask 119 with the dual damascene method, the disadvantage of depositions of fluorocarbon base around the opening of via hole 117 is not produced as shown in FIG. 7C.

While the aforementioned description takes an example in which the etching gas includes "$CF_4$", the etching gas may include "$C_2F_6$". In addition, the aforementioned description takes an example in which the pressure of the etching gas is "300 to 400 [mTorr]", the pressure may be any which is "100 [mTorr]" or higher.

The aforementioned description shows that the production of depositions is prevented around the opening of via hole 117 in the structure in which via hole 117 with a relatively small width positioned at the bottom of concave groove 120 with a relatively large width. It should be noted that concave groove 120 extends in the front-to-back direction and via hole 117 does not extend in the front-to-back direction as described above. Thus, even when concave groove 120 has the same width as via hole 117 or even when via hole 117 has a width larger than concave groove 120, the present invention is applicable since a difference in height is present in which depositions may occur around of the opening of via hole 117 in the front-to-back direction.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a semiconductor integrated circuit comprising the steps of:

disposing an upper interlayer on a stopper film layered on a surface of a lower interlayer film including a metal wiring embedded in a concave formed therein;

forming a via hole extending from the surface of said upper interlayer film to the surface of said stopper film at an opposite position to said metal wiring;

forming an organic film on the surface of said upper interlayer film and embedding the material of said organic film in said via hole, and forming a resist mask with an opening to communicate with the opening of said via hole on the surface of said organic film;

plasma etching said organic film formed on the surface of said upper interlayer film through the opening in said resist mask in an atmosphere of an etching gas and an inert gas;

simultaneously plasma etching said upper interlayer film exposed by plasma etching said organic film and the material of said organic film embedded in said via hole to such depth which does not reach said stopper film in an atmosphere of an etching gas and an inert gas with the etching rate for said organic film with said etching gas higher than the etching rate for said upper interlayer film with said etching gas; and removing the material of said organic film remaining in said via hole positioned at the bottom of a concave groove formed by said plasma etching and etching said stopper film positioned at the bottom of said via hole from which the material of said organic film is removed to expose said metal wiring.

2. A method of manufacturing a semiconductor integrated circuit comprising the steps of:

disposing an upper interlayer on a stopper film layered on a surface of a lower interlayer film including a metal wiring embedded in a concave formed therein;

forming a via hole extending from the surface of said upper interlayer film to the surface of said stopper film at an opposite position to said metal wiring;

forming an organic film on the surface of said upper interlayer film and embedding the material of said organic film in said via hole, and forming a resist mask with an opening to communicate with the opening of said via hole on the surface of said organic film;

plasma etching said organic film formed on the surface of said tipper interlayer film through the opening in said resist mask in an atmosphere of an etching gas including a molecular structure which produces no deposition and an inert gas;

simultaneously plasma etching said upper interlayer film exposed by plasma etching said organic film and the material of said organic film embedded in said via hole to such depth which does not reach said stopper film in an atmosphere of an etching gas and an inert gas; and removing the material of said organic film remaining in said via hole positioned at the bottom of a concave groove formed by said plasma etching and etching said stopper film positioned at the bottom of said via hole from which the material of said organic film is removed to expose said metal wiring.

3. The method of manufacturing a semiconductor integrated circuit according to claim 1, wherein said etching gas includes atoms of fluorine and atoms of carbon contained in a molecular structure, the number of the atoms of fluorine being three times or more than the number of the atoms of carbon.

4. The method of manufacturing a semiconductor integrated circuit according to claim 3, wherein said etching gas comprises $CF_4$.

5. The method of manufacturing a semiconductor integrated circuit according to claim 3, wherein said etching gas comprises $C_2F_6$.

6. The method of manufacturing a semiconductor integrated circuit according to claim 2, wherein said etching gas includes atoms of fluorine and atoms of carbon contained in a molecular structure, the number of the atoms of fluorine being three times or more than the number of the atoms of carbon.

7. The method of manufacturing a semiconductor integrated circuit according to claim 6, wherein said etching gas comprises $CF_4$.

8. The method of manufacturing a semiconductor integrated circuit according to claim 6, wherein said etching gas comprises $C_2F_6$.

9. The method of manufacturing a semiconductor integrated circuit according to claim 1, wherein a pressure in said atmosphere is 100 mTorr or higher.

10. The method of manufacturing a semiconductor integrated circuit according to claim 2, wherein a pressure in said atmosphere is 100 mTorr or higher.

* * * * *